US 6,690,174 B2

(12) United States Patent
Sigwart et al.

(10) Patent No.: US 6,690,174 B2
(45) Date of Patent: Feb. 10, 2004

(54) METHOD AND ARRANGEMENT FOR LOAD TESTING ELECTRICAL SYSTEMS OF A MOTOR VEHICLE

(75) Inventors: Andreas Sigwart, Hueckeswagen (DE); Holm Freese, Duesseldorf (DE); Karl-Heinz Richarz, Bonn (DE); Peter Bockemuehl, Kuerten (DE)

(73) Assignee: Ford Motor Company, Dearborn, MI (US)

( * ) Notice: Subject to any disclaimer, the term of this patent is extended or adjusted under 35 U.S.C. 154(b) by 0 days.

(21) Appl. No.: 10/003,966

(22) Filed: Oct. 31, 2001

(65) Prior Publication Data

US 2002/0088271 A1 Jul. 11, 2002

(30) Foreign Application Priority Data

Oct. 31, 2000 (EP) .............................. 00123729

(51) Int. Cl.[7] .............................. G01R 31/14; G01L 3/26
(52) U.S. Cl. ...................... 324/511; 324/501; 73/117.1; 73/865.6
(58) Field of Search ............................ 73/865.6, 865.9, 73/117.1, 669, 670; 324/501, 511, 512, 514, 537, 555, 503, 508, 509, 415, 158.1, 431; 180/443; 901/50

(56) References Cited

U.S. PATENT DOCUMENTS

| 4,161,116 | A | * | 7/1979 | Fegraus et al. ................ 73/117 |
| 4,964,298 | A | * | 10/1990 | Matsushita .................. 73/117.1 |
| 5,025,659 | A | * | 6/1991 | Starr et al. .................... 73/147 |
| 5,060,176 | A | * | 10/1991 | Nawa et al. ................... 701/51 |
| 5,167,146 | A | * | 12/1992 | Hostetter ................... 73/117.1 |

FOREIGN PATENT DOCUMENTS

DE 3105491 A1 * 12/1982 .......... G01M/19/00

* cited by examiner

Primary Examiner—Jay Patidar
Assistant Examiner—Vincent Q. Nguyen
(74) Attorney, Agent, or Firm—Carlos L. Hanze

(57) ABSTRACT

The invention relates to a method and arrangement for load testing electrical systems of a motor vehicle. The operator control elements of the electrical systems are activated via an externally controlled robot during a test period of typically 7 to 14 days. The motor vehicle containing the electrical systems is located during the test in a simulation chamber in which the temperature and/or atmospheric humidity can be set by an air-conditioning system, and simulated solar radiation are set by one or more radiators. In addition, acceleration forces occurring during driving are simulated via a road simulator. The forces and moments occurring when the operator control elements are activated are preferably sensed and recorded for analysis and evaluation.

31 Claims, 5 Drawing Sheets

Fig. 4

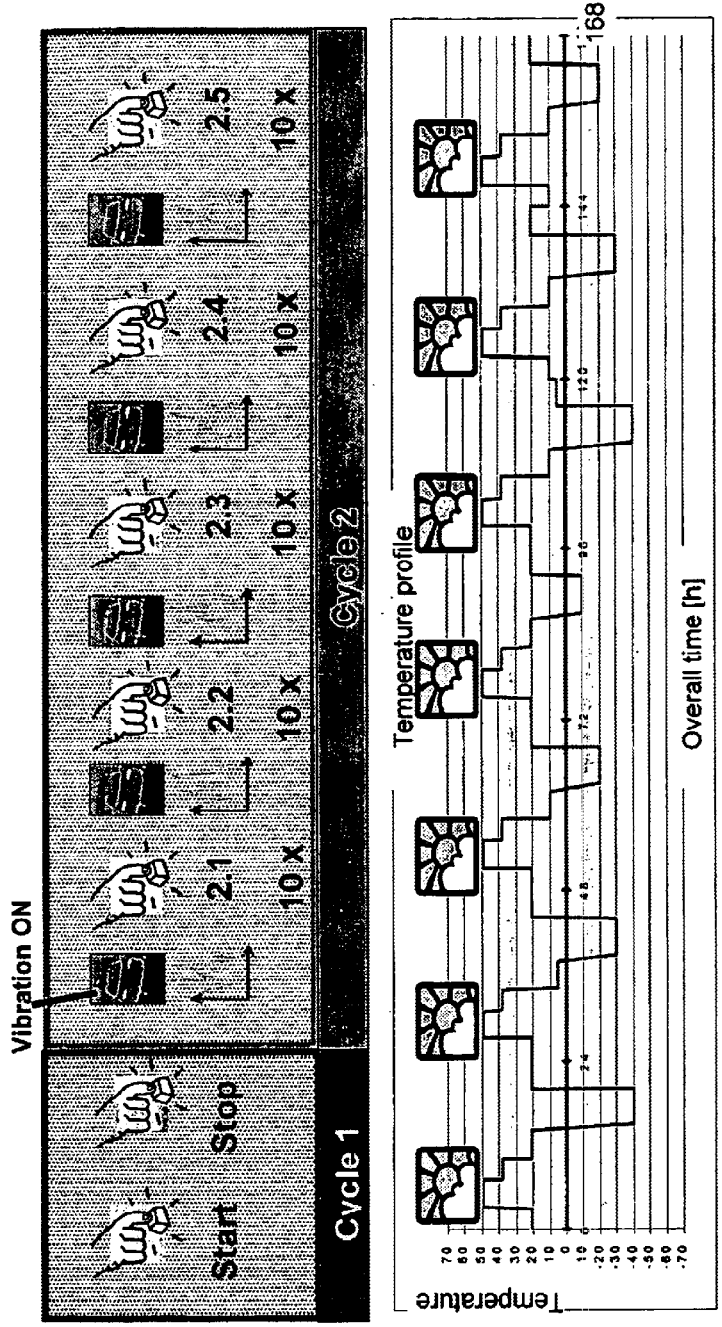
Fig. 5  Fig. 6  Fig. 7

METHOD AND ARRANGEMENT FOR LOAD TESTING ELECTRICAL SYSTEMS OF A MOTOR VEHICLE

BACKGROUND OF THE INVENTION

1. Field of the Invention

The invention relates to a method for load testing electrical systems of a motor vehicle, the operator control elements of the systems being activated on a test basis by at least one automatic activation device. In addition, the invention relates to a device for carrying out the aforesaid method.

2. Background Information

Electrical and electronic systems of growing complexity are being increasingly used in motor vehicles. For this reason, load testing such electrical systems—which is also understood to refer to electronic systems in what follows—is particularly important. Load testing is intended to determine whether the systems have a sufficiently long service life and are sufficiently operationally capable. In such a context, specifically the operator control elements of the electrical systems are to be subject to testing because these are subjected to high mechanical loading, and are thus especially prone to wear and failure phenomena.

DE 31 05 491 C2 discloses in this respect a service-life testing device for electromechanical components of motor vehicles in which repeated activation of a switch can be performed in a test setup using stepping motors. At the same time, relevant data on the forces and moments occurring in the process can be recorded. Such a device permits a switch to be tested in terms of its behavior in the case of frequently repeated activation. However, it is apparent that the results acquired from such testing are not sufficient to evaluate the behavior of the switch under real conditions. For example, when electrical systems are used, including the operator control elements in a motor vehicle, under real conditions, numerous and complex interactions of the systems with one another and large degrees of variation of the loading occur owing to real ambient conditions.

Against this background, an advantage of the present invention is to make available a method and arrangement for load testing electrical systems of a motor vehicle which permit the behavior and the loading to be evaluated better under real conditions.

In accordance with the present invention, a method for load testing electrical systems (including electronic systems) of a motor vehicle is provided wherein the operator control elements of the systems are activated repeatedly for test purposes by means of at least one automatic activation device. The method is defined in that the electrical systems are tested in their installed, operationally capable state in a motor vehicle, and that the motor vehicle is subjected during this testing to a simulation of real ambient conditions.

The method according to the invention achieves a considerably better approximation to the real conditions of use of the electrical systems. This is done by virtue of the fact that the electrical systems or the associated operator control elements are not tested isolated in an artificial setup but rather are tested in their ultimate installation state in the motor vehicle. As a result, interactions between the electrical systems and also interactions between an electrical system or an operator control element and the motor vehicle are taken into account. For example, the behavior of a switch can differ greatly depending on the installation location and the method of installation, and the proposed method ensures that the testing is based on the actual installation conditions.

A further essential improvement in the test results is achieved by virtue of the fact that the motor vehicle is subjected during the testing to a simulation of real ambient conditions that can also have a considerable influence on the behavior of the systems and operator control elements.

In this context, the simulated ambient conditions can include in particular the ambient temperature. This is varied during the testing in a range that corresponds to the temperatures that can occur during real use of the motor vehicle. Typically, this temperature range lies between $-40°$ C. and $+85°$ C. The distribution of the testing time against the temperatures can be selected on the basis of the real temperature distribution to which a motor vehicle is typically subject during its service life. However, extreme temperatures are preferably used during the testing because they have a particularly loading effect and are thus highly significant in determining the loading limit.

Furthermore, the simulated ambient conditions can include the atmospheric humidity because this also has a considerable influence on the loading behavior of the systems or operator control elements to be tested. The atmospheric humidity is preferably varied during the test in the fluctuation range occurring under real conditions.

The simulated ambient conditions can also include the solar radiation that is preferably simulated by artificial irradiation with light with a suitable wavelength distribution (spectrum) and with a power of typically 4,000 $W/m^2$.

Finally, the simulated ambient conditions can also include acceleration events of the motor vehicle that typically occur under real conditions. In particular, high-frequency acceleration events (e.g., impacts, vibrations, etc.) can understandably have a considerable influence on the mechanical behavior of the systems and operator control elements to be tested. In addition, acceleration events in the vertical direction are of special interest, and can be simulated by vertical movement of the contact faces of the wheels. Here, the contact faces under the wheels of the front axle should preferably be capable of being moved independently of the contact faces under the wheels of the rear axle. It is particularly preferred if all the contact faces of the wheels can be actuated and moved independently of one another. The acceleration program to which the motor vehicle is subjected can be predefined by acceleration events recorded during a real journey in order to ensure a particularly realistic simulation.

A robot is preferably used for automatically activating the operator control elements. Such a robot has the advantage that even complex operator control procedures and sequences of activations of various operator control elements can be performed with it in a flexible way, it being possible, for example, to predefine the movement sequences by means of so-called "teach-in" methods. Using a robot also has the advantage that it approximates particularly closely to the conditions when the operator control elements are activated by a driver, in terms of the application of force and the movement sequence.

During the activation of the control elements, the forces and torques occurring in the process are preferably sensed by sensor means on the activation device. The data acquired in this manner can then be evaluated later or simultaneously (online) with suitable analysis methods and provides valuable indications of behavior and changes of the operator control elements.

The activation of the operator control elements of the electrical systems is advantageously carried out in such a way that the forces and torques occurring in the process vary in terms of their magnitude and their direction. This also makes the load testing approximate better to reality because the activation of such operator control elements by a human is always subject to certain variations. In particular, activation operations that are less than optimum or incorrect can also be carried out in order to sense their influence.

The invention also relates to a device for load testing electrical systems (including electronic systems) of a motor vehicle, which has an automatic activation device for activating the operator control elements of the systems. The device is defined in that it contains a simulation chamber, in which a motor vehicle that contains the systems to be tested can be accommodated and in which ambient conditions can be simulated for the entire motor vehicle. Furthermore, the automatic activation device is configured in such a way that, during the operating state, it can be arranged, within a motor vehicle, with the systems to be tested.

The aforesaid device permits the abovementioned method to be carried out so that the advantages described above can be achieved. In particular, greater approximation of the load testing to reality can be achieved by testing the systems in the installed state in a motor vehicle and under (simulated) ambient conditions.

The simulation chamber can in particular have an air-conditioning system with which real climatic conditions in terms of temperature, atmospheric humidity and the like can be simulated.

In addition, the simulation chamber can have radiators for outputting electromagnetic radiation of a suitable spectrum in order to simulate the effect of solar radiation.

Furthermore, the simulation chamber preferably contains what is referred to as a road simulator for simulating acceleration events that act on a motor vehicle during a journey. The road simulator can be formed in particular from contact faces for the wheels of a motor vehicle that can be moved separately in the vertical direction using an actuation means.

The activation device also advantageously contains sensors with which the forces and torques that occur during the activation of operator control elements of the electrical systems can be sensed. The signals of these sensors can be recorded or evaluated in real time in order to be able to draw important conclusions about the behavior of the operator control elements.

The activation device is preferably a robot. Such a robot has the advantage that even complex operator control procedures and sequences of activations of different operator control elements can be performed with it in a flexible way, it being possible, for example, to predefine the movement sequences by means of a "teach-in" procedure. Using a robot also has the advantage that it approximates particularly well to the conditions when the operator control elements are activated by a driver, in terms of the application of force and the movement sequence.

The robot is advantageously provided with a protective sleeve whose interior can be air-conditioned. In this way it is possible to ensure that the robot operates reliably irrespective of the (simulated) ambient conditions prevailing around it.

Further advantages, objects and features of the invention will become apparent from the following detailed description of the invention taken in conjunction with the accompanying figures showing illustrative embodiments of the invention.

BRIEF DESCRIPTION OF THE DRAWINGS

For a complete understanding of the present invention and the advantages thereof, reference is now made to the following description taken in conjunction with the accompanying drawings in which like reference numerals indicate like features and wherein:

FIG. 4 shows an activation plan for various operator control elements;

FIG. 5 shows the timing of a vibration simulation;

FIG. 6 shows the timing of the ambient temperature simulation;

FIG. 7 shows the frequency distribution of the simulated temperatures;

DETAILED DESCRIPTION OF THE PREFERRED EMBODIMENTS

Figure 1:
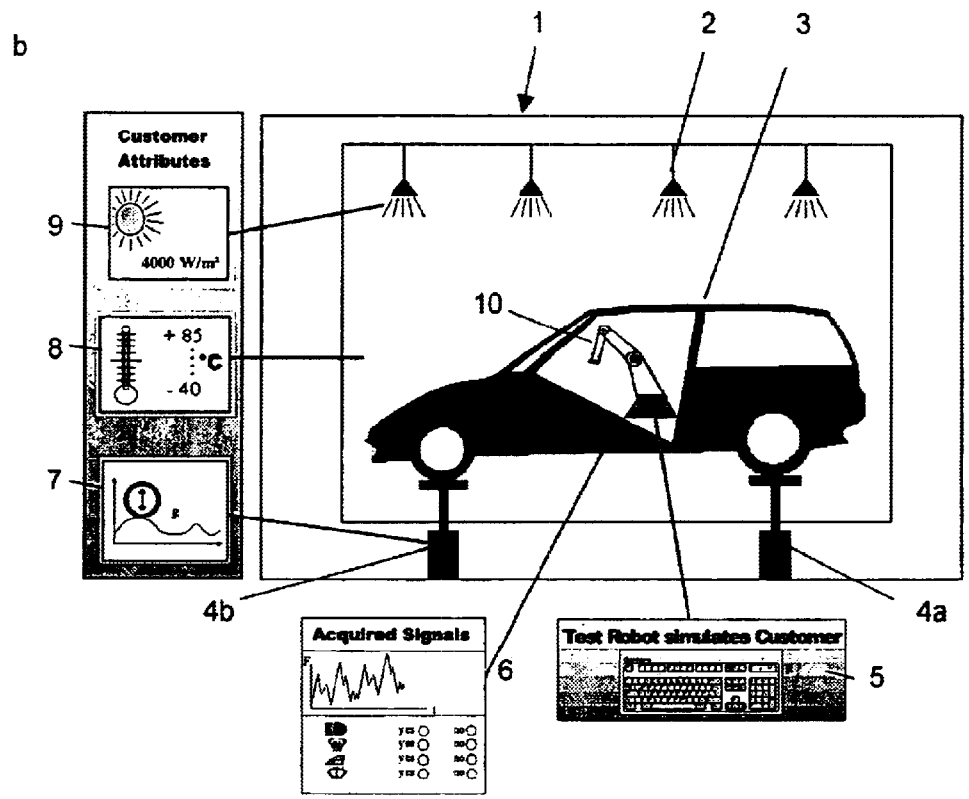
FIG. 1 shows a schematic view of the components of a load testing arrangement according to the invention.

FIG. 1 is a schematic view of the device according to the invention for carrying out load testing on electrical systems of a motor vehicle 3. The electrical systems or their operator control elements, for example rotary switches, toggle switches, sliders, etc., are tested here in the installed state in the motor vehicle 3.

For this purpose, the motor vehicle 3 is located in a simulation chamber 1 in which real ambient conditions can be simulated for the entire motor vehicle 3. In particular, radiators 2 mounted on the ceiling of the simulation chamber can be used to simulate solar radiation 9 with a value of typically 4,000 W/m$^2$. An air-conditioning system 8 can be used to simulate the ambient temperature and the atmospheric humidity in accordance with a predefined program. Furthermore, a four-channel road simulator 7, which contains contact faces 4a, 4b, which can be moved independently of one another in the vertical direction, for the wheels of the motor vehicle, is provided in the simulation chamber 1. This road simulator can simulate vertical acceleration events that occur during a typical journey of the motor vehicle 3. The program of the acceleration events can originate, for example, from measurements during a real journey.

A robot 10 is provided in the motor vehicle for activating the operator control elements of the electrical systems. Said robot 10 is advantageously arranged at the position of the driver's seat so that the conditions are as realistic as possible in terms of the application of force. The robot 10 is operated via a control device 5 in accordance with a predefinable program. By means of the robot 10 it is possible to carry out in succession even complex activation procedures of different operator control elements. In this way, realistic interactions between the electrical systems can be simulated. The robot 10 can be equipped with a rigid grip as activation element, but it is also possible to attach a pneumatic grip that permits additional degrees of freedom. In particular, the arm of the robot can be of bionic design, that is to say permit the toggle switches or rotary switches to be activated in a force-controlled fashion.

The robot 10 is preferably equipped with sensors that measure the forces and torques that occur during the activation of an operator control element. These forces and torques can be read out via the signal line 6 and recorded for analysis.

The simulation chamber 1 according to the invention and the robot 10 can thus be used for fatigue testing the electronics, in which testing even extreme climatic conditions can be taken into account. In this way, the reliability and operational durability of components and systems can be tested to a certain extent in a timescale of typical operating cycles of 10 years and 277,800 km (150,000 miles). The device can be used to simulate the road conditions and the climatic conditions in an integrated test cycle, and at the same time the electrical components can be activated. In this way, the laboratory conditions can be approximated better to reality, and in addition the time required for the necessary tests can be reduced.

Figure 2:
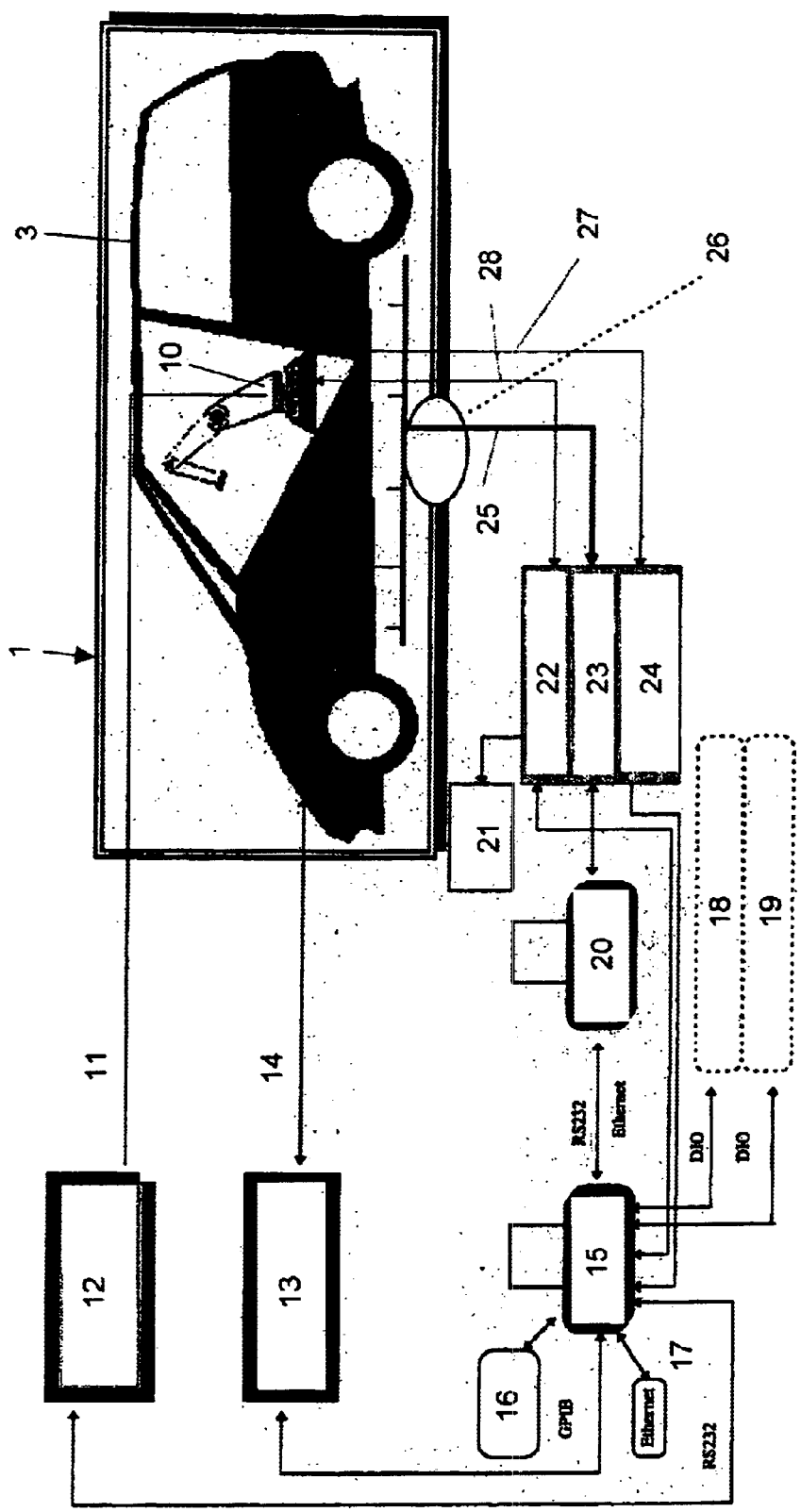
FIG. 2 shows the detailed structure of the device according to FIG. 1.

FIG. 2 shows the various components of the test device in FIG. 1 in more detail. Identical components to those in FIG. 1 are provided here with the same reference numerals.

The motor vehicle 3 with the systems to be tested is located in an air-conditioned chamber 1 for a complete vehicle in which temperatures between −40° C. and +85° C. can be generated with any desired profiles, and extreme solar radiation can also be simulated. At the same time, the vibrations that are typical of a roadway can be generated by means of a four-channel road simulator.

The components shown in FIG. 2 are used in particular for operating the robot 10 by means of which the operator control elements of the electrical systems in the motor vehicle are activated. The robot 10 is provided here with a protective sleeve so that it can operate reliably at all temperatures occurring in the simulation chamber 1. The air-conditioned protective sleeve of the robot 10 is connected to the robot's foot via tubes 11 for a specific cooling and heating fluid to a mobile air-conditioning unit 12 outside the air-conditioned chamber 1. The air-conditioning unit 12 is controlled by means of temperature sensors in the interior of the protective sleeve and, depending on the temperature in the air-conditioned chamber 1 generates warm or cold air that is conducted into the protective sleeve. The temperature in the protective sleeve can thus be kept within a permitted temperature range of approximately 5° C. to 35° C. irrespective of the ambient temperature (−40° C. to +85° C.). Temperature and flow sensors monitor the interior of the protective sleeve and issue messages if irregularities occur.

A computer-based robot controller 15 controls the air-conditioning unit 12. This computer controller 15 also controls a power supply 13 for the robot that is connected to the robot via a voltage line 14 of 8 to 18 volts.

In addition, the computer controller 15 is connected via digital interfaces to a controller 18 of the air-conditioned chamber (Weiss) and to a device 19 for generating hydropulses. The computer controller 15 is also connected to a PC-based data collection unit 20, it being possible for the aforesaid connection to be formed via a parallel interface (RS 232) or an Ethernet. The data collection unit 20 can be used to measure and observe all the electrical systems during the testing in order to represent the logical functions, including voltages and currents in real time, and provide visual indications of degradations due to influences such as, for example, wear.

The modules 22, 23 and 24 are provided for directly actuating, and communicating with, the robot 10. The module 22 is a control unit via which the control signals 28 are conducted to the robot 10. The control unit 22 is also connected to the computer controller 15 and to a teaching unit 21, the latter also permitting the activation positions to be programmed using a "teach-in" method whereby the robot for example is manually configured, "taught", or otherwise adapted to operate in accordance with a test sequence being programmed on a PC. This method enables even complicated tasks to be carried out and, for example, a large number of operator control elements to be activated successively or alternately. It is even possible to use the robot 10 to carry out set tasks such as, for example, intentionally incorrect activation with unequal loading, which also occurs in practice.

The data collection module 23 collects measurement data 25 from the interior of the air-conditioned chamber 1 (for example voltage, temperature, current, DIO) and passes it on to the PC-based data collection means 20. In this context, it is possible, in particular, also to observe the mutual influence between modules, such as occurs, for example, as a result of discharge currents at interfaces.

Finally, a force/torque booster 24 is provided which senses the reactions 27 occurring when the operator control elements are activated, such as in particular switching forces Fx, Fy, Fz and switching moments Mx, My, Mz, and passes them on to the computer controller 15 after boosting. The force and torque are recorded here at each activation operation, and the measured values are logged and made available in the form of statistics.

Figure 3:
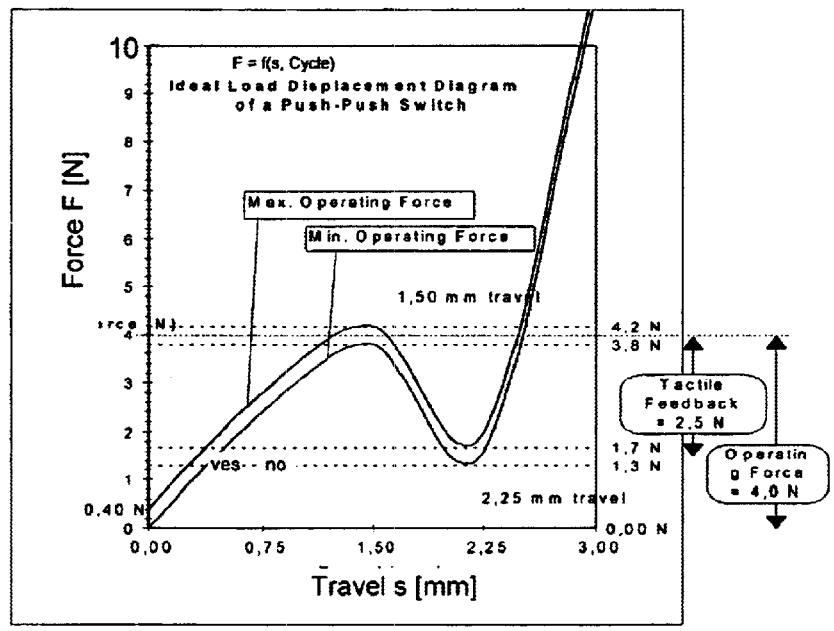
FIG. 3 shows a force/travel diagram for a typical operator control element.

FIG. 3 shows a typical force/travel relationship during the activation of a switch. The travel s executed by the switch is represented here in millimeters (mm) on the horizontal axis, and the force F is represented in Newtons (N) on the vertical axis. Such force/travel curves and torque/angle curves permit changes in the switching forces to be detected and provide tactile feedback for the robot.

Figure 4:
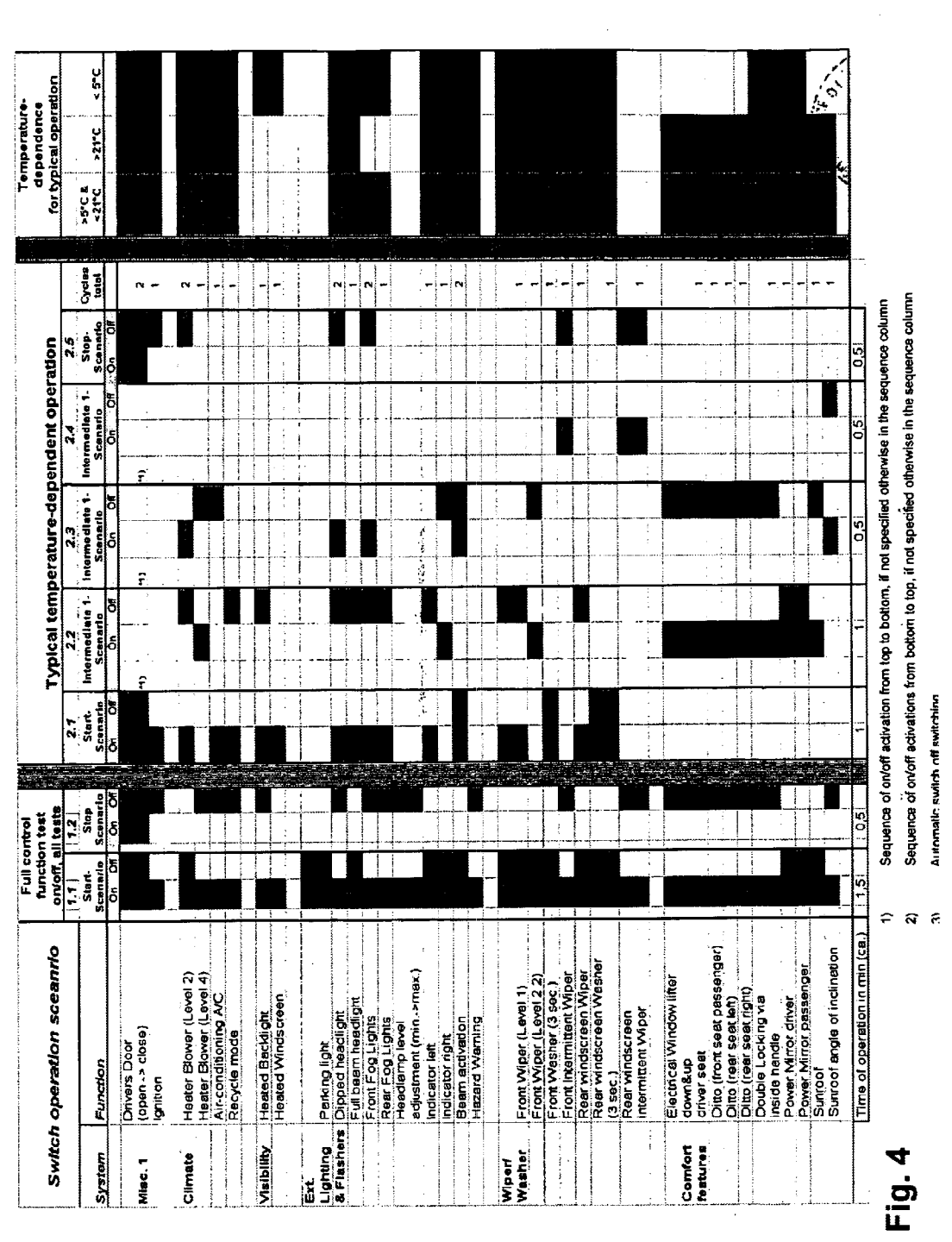

FIG. 4 shows a typical program for activating various switches present in a motor vehicle.

FIG. 5 shows the time sequence of the generation of vibrations during a test cycle, and FIGS. 6 and 7 show the temperature profile set during a 7-day test, and the frequency of the temperatures occurring there as a percentage.

Figure 8:
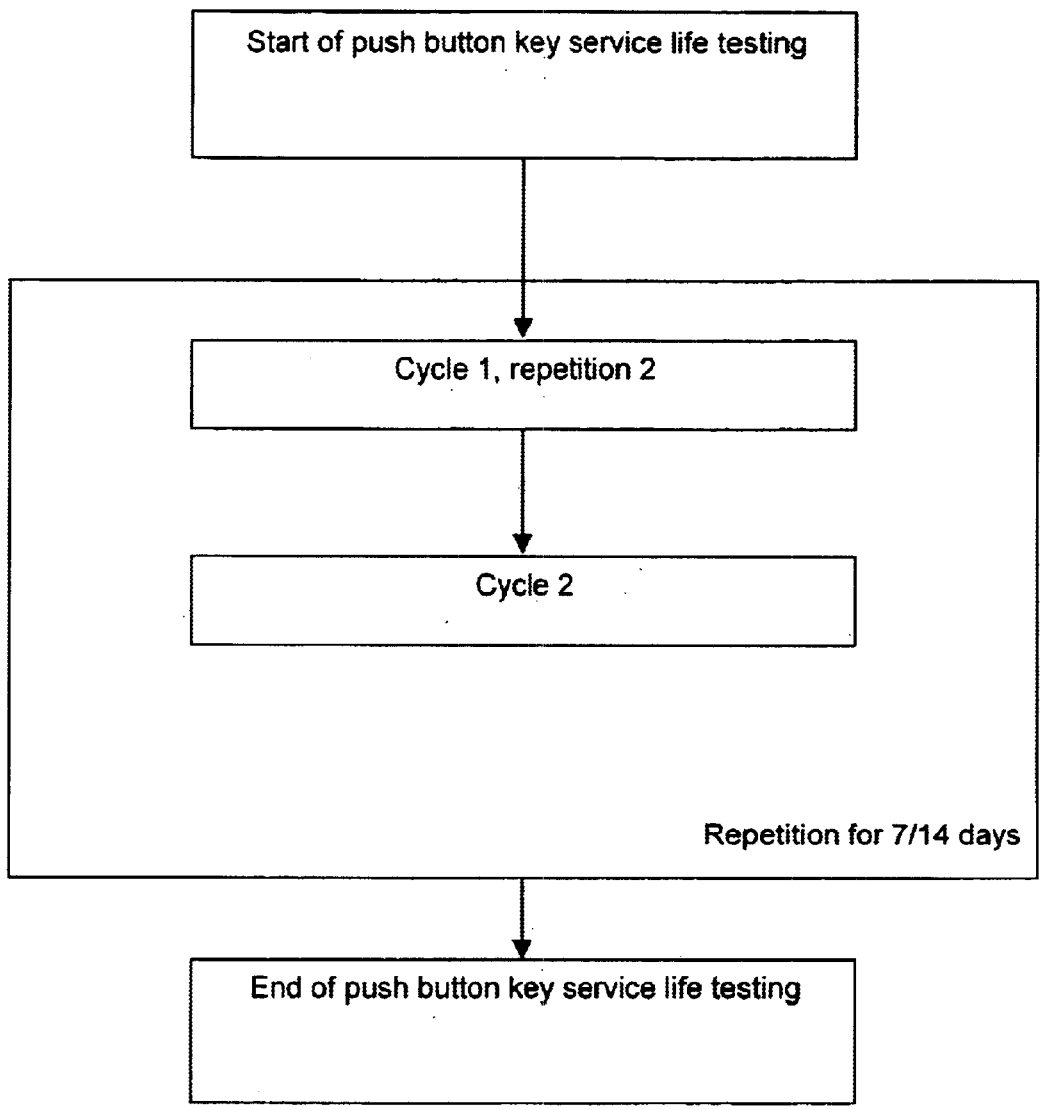
FIG. 8 shows a flowchart of the test behavior.

FIG. 8 is a simplified flowchart for a 7-day or 14-day testing procedure. As is apparent, the vibration profile illustrated in FIG. 5 is repeated continuously during the entire test period of 7/14 days, the vibrations being interrupted approximately every two minutes in order to carry out the switch activation operations in accordance with the scenarios listed in FIG. 4.

The test program according to the invention, which is carried out around the clock during the entire test period can compress the loading of the entire service life of a motor vehicle (approximately 10 years) into a loading test of approximately four weeks in duration. At the same time, a high degree of approximation to reality and, owing to the automation, a high degree of reproducibility of the results, and thus a high reliability level of the results, are obtained.

Although the present invention has been described in connection with particular embodiments thereof, it is to be understood that various modifications, alterations and adaptations may be made by those skilled in the art without departing from the spirit and scope of the invention. It is intended that the invention be limited only by the appended claims.

What is claimed is:

1. A method for load testing an electrical system installed in a motor vehicle, comprising:

controlling at least one automatic activation device to apply a mechanical load to one or more operator control elements of the installed electrical system, thereby varying forces and moments applied to the one or more operator control elements; and exposing the motor vehicle and the installed electrical system to simulated ambient conditions during the load testing of the installed electrical system.

2. The method according to claim 1, wherein said controlling step comprises the step of controlling the at least one automatic activation device in accordance with an activation procedure corresponding to the one or more operator control elements.

3. The method according to claim 1, wherein said controlling step comprises the step of adapting the at least one automatic activation device to operate in accordance with one or more predefined movement sequences.

4. The method according to claim 1, wherein said exposing step comprises subjecting the motor vehicle to a range of temperatures likely to occur during the service life of the motor vehicle.

5. The method according to claim 1, wherein said exposing step comprises subjecting the motor vehicle to temperature profiles likely to occur during the service life of the motor vehicle.

6. The method according to claim 1, wherein said exposing step comprises subjecting the motor vehicle to temperature distributions likely to occur during the service life of the motor vehicle.

7. The method according to claim 1, wherein said exposing step comprises subjecting the motor vehicle to a range of atmospheric humidity levels likely to occur during the service life of the motor vehicle.

8. The method according to claim 1, wherein said exposing step comprises irradiating the motor vehicle in order to simulate solar radiation levels likely to occur during the service life of the motor vehicle.

9. The method according to claim 1, wherein said exposing step comprises subjecting the motor vehicle to vibration profiles representative of vibration forces likely to occur during the service life of the motor vehicle.

10. The method according to claim 1, wherein said exposing step comprises subjecting the motor vehicle to acceleration events likely to occur during the service life of the motor vehicle.

11. The method according to claim 10, wherein said step of subjecting the motor vehicle to acceleration events comprises simulating mutually independent vertical movements of one or more wheels of the motor vehicle.

12. The method according to claim 1, further comprising the step of sensing forces and moments on the operator control elements when the mechanical load is applied thereto.

13. The method according to claim 1, further comprising the step of recording signals representative of forces and moments on the operator control elements when the mechanical load is applied thereto.

14. An arrangement for load testing for load testing an electrical system installed in a motor vehicle, comprising:

at least one automatic activation device for applying a mechanical load to one or more operator control elements of the installed electrical system, thereby varying forces and moments applied to the one or more operator control elements; and an apparatus for exposing the motor vehicle and the installed electrical system to simulated ambient conditions during the load testing of the installed electrical system.

15. The arrangement according to claim 14, further comprising at least one operator control device electronically coupled to said automatic activation device for controlling operation of one or more of said automatic activation device and said apparatus for exposing the motor vehicle and the installed electrical system to the simulated ambient conditions.

16. The arrangement according to claim 14, wherein said at least one automatic activation device is arranged inside the motor vehicle.

17. The arrangement according to claim 14, wherein the simulated ambient conditions comprise temperature.

18. The arrangement according to claim 14, wherein the simulated ambient conditions comprise atmospheric humidity.

19. The arrangement according to claim 14, wherein the simulated ambient conditions comprise solar radiation.

20. The arrangement according to claim 14, wherein the simulated ambient conditions comprise acceleration events.

21. The arrangement according to claim 14, wherein the simulated ambient conditions comprise vibration forces.

22. The arrangement according to claim 14, wherein said apparatus comprises a simulation chamber in which the ambient conditions are simulated.

23. The arrangement according to claim 22, wherein said simulation chamber comprises an air-conditioning system for simulating one or both of ambient temperature and atmospheric humidity.

24. The arrangement according to claim 22, wherein said simulation chamber comprises radiators for simulating solar radiation.

25. The arrangement according to claim 22, wherein said simulation chamber comprises a road simulator in communication the motor vehicle for simulating road conditions.

26. The arrangement according to claim 25, wherein said road simulator comprises:

one or more contact faces disposed within said simulation chamber and in communication with corresponding wheels of the motor vehicle; and control means for actuating said contact faces to simulate mutually independent vertical movements of the corresponding wheels of the motor vehicle.

27. The arrangement according to claim 14, further comprising at least one sensor for sensing forces and moments when operator control elements of the electrical system are activated.

28. The arrangement according to claim 14, wherein said automatic activation device is a robot.

29. The arrangement according to claim 28, wherein said robot comprises a protective sleeve having an interior that can be air-conditioned independently of the simulated ambient conditions.

30. The arrangement according to claim 14, further comprising means for recording signals representative of forces and moments on the operator control elements when the mechanical load is applied thereto.

31. The arrangement according to claim 14, further comprising:

at least one operator control device electronically coupled to said automatic activation device for controlling operation of one or more of said automatic activation device and said apparatus for exposing the motor vehicle and the installed electrical system to the simulated ambient conditions; and a teaching unit electronically coupled to the at least one operator control device for programming activation positions for the operator control elements.

* * * * *